(12) United States Patent
Shieh

(10) Patent No.: US 6,742,156 B2
(45) Date of Patent: *May 25, 2004

(54) DECODING SYSTEM AND METHOD IN AN OPTICAL DISK STORAGE DEVICE

(75) Inventor: Jia-Horng Shieh, Junghe (TW)

(73) Assignee: Acer Laboratories Inc. (TW)

( * ) Notice: Subject to any disclaimer, the term of this patent is extended or adjusted under 35 U.S.C. 154(b) by 432 days.

This patent is subject to a terminal disclaimer.

(21) Appl. No.: 09/828,185

(22) Filed: Apr. 9, 2001

(65) Prior Publication Data

US 2002/0104055 A1 Aug. 1, 2002

(30) Foreign Application Priority Data

Dec. 15, 2000 (TW) .......................... 89126859 A

(51) Int. Cl.$^7$ .................. H03M 13/03; H03M 13/00
(52) U.S. Cl. ...................... 714/756; 714/784
(58) Field of Search .................. 714/755, 756, 714/752, 784, 785

(56) References Cited

U.S. PATENT DOCUMENTS

| | | | | |
|---|---|---|---|---|
| 6,009,549 A | * | 12/1999 | Bliss et al. | 714/769 |
| 6,052,815 A | * | 4/2000 | Zook | 714/758 |
| 6,158,039 A | * | 12/2000 | Cho et al. | 714/769 |
| 6,167,548 A | * | 12/2000 | Yamakura | 714/763 |
| 6,317,855 B1 | * | 11/2001 | Horibe | 714/752 |
| 6,470,473 B1 | * | 10/2002 | Iwasa | 714/785 |
| 6,543,026 B1 | * | 4/2003 | Dadurian | 714/785 |

* cited by examiner

*Primary Examiner*—Albert Decady
*Assistant Examiner*—Esaw Abraham
(74) *Attorney, Agent, or Firm*—Michael D. Bednarek; Shaw Pittman LLP

(57) ABSTRACT

The present invention provides a decoding system and method for an optical disk for receiving and decoding data from the disk. The present invention does not need to increase the clock frequency and the bus width of the decoding system, it can effectively decrease the access times to the data buffer and the system response time by changing the structure of the conventional decoding system, in this way the present invention increases the parallel process capability and the speed of the decoding, thus, it can become a high speed DVD.

6 Claims, 7 Drawing Sheets

DECODING SYSTEM AND METHOD IN AN OPTICAL DISK STORAGE DEVICE

REFERENCE TO RELATED APPLICATION

This application claims the benefit of priority under 35 U.S.C. § 119(a) of Taiwan Patent Application No. 089126859, titled "Decoding System and Method in an Optical Disk Storage Device," filed on Dec. 15, 2000.

BACKGROUND OF THE INVENTION

1. Field of the Invention

This invention relates in general to a decoding system and method, and more particularly to a decoding system and method in an optical storage device with high decoding speed by decreasing the access times to a data buffer.

2. Description of the Related Art

Referring now to FIG. 1, it is a block diagram of a conventional decoding system in a DVD storage device. As shown in FIG. 1, a demodulator 102 reads the data stored in the disk 100 for converting 16 bit code words into 8 bit data symbols. Then, the demodulator 102 generates an ECC (Error Correction Code) block 107 and transmits the ECC block 107 to a data buffer 106 through a bus 104. The ECC block 107 comprises main data 108, a PO (parity of outer-code) 110 and a PI (parity of inner-code) 112. Main data 108 appended with the PO 110 forms an outer-code of RS (Reed Solomon), and main data 108 appended with the PO 110 and the PI 112 forms an inner-code of RS. ECC decoder 114 reads the ECC block 107 from the data buffer 106 to perform the error correction decoding along the PI direction (i.e. X direction) and PO direction (i.e. Y direction) of the ECC block 107 in turn. Then, the ECC decoder 114 writes the corrected part of the ECC block 107 into the data buffer 106. The de-scrambler and EDC (Error Detection Code) check 116 reads the corrected main data 108 stored in the data buffer 106 for de-scrambling the main data 108 and checking whether errors in the main data 108 are corrected. When the host needs the main data 108, an ATAPI (Advanced Technology Attachment Packet Interface) 118 reads the main data 108 in the data buffer 106, then de-scrambles and transmits the main data 108 to the host.

Referring to FIG. 2, it illustrates a flow chart of the conventional decoding system accessing to the data buffer in a DVD storage device. At a step 201, after performing demodulation, a demodulator 102 writes an ECC block 107 into a data buffer 106. Next, at a step 202, an ECC decoder 114 reads the ECC block 107 of the PI direction to perform the error correction decoding, then writes the corrected part of the ECC block 107 into the data buffer 106. Continuing the step 202, it flows to a step 203, the ECC decoder 114 reads the ECC block 107 of the PO direction to perform the error correction decoding, then writes the corrected part of the ECC block 107 into the data buffer 106. After finishing the step 203, the system can repeat the steps 202 and 203 to enhance the error correction capability according to the setting of the system. Then at a step 204, the de-scrambler and EDC check 116 reads the corrected main data 108 stored in the data buffer 106 for de-scrambling the main data 108 and checking whether errors in the main data 108 are corrected. When the host needs the main data 108, at a step 205, an ATAPI 118 reads the main data 108 stored in the data buffer 106, then de-scrambles and transmits the main data 108 to the host. In the preceding prior art, each module of the decoding system needs to run the above-mentioned steps in turn to finish the decoding process in a DVD storage device.

Referring now to FIG. 3, it illustrates a flow chart of decoding RS code in a conventional ECC decoder. At a stage 301, original code words in the data buffer 106 enter the stage of syndrome generation, wherein the ECC decoder 114 calculates the PI syndrome or the PO syndrome. Next, at a stage 302, the ECC decoder 114 calculates the "erasure location polynomial" according to the known erasure location, then calculates the "Forney's modified syndrome polynomial" and gets the initial value of the next stage according to the calculated syndromes and erasure location polynomial. Continuing the stage 302, at a stage 303, the ECC decoder 114 calculates the "error-erasure locator polynomial" and "error erasure evaluator polynomial" according to the initial value produced by the previous stage 302. Then, at a stage 304, a Chien search unit finds the error locations and error magnitudes. Finally, at a stage 305, the ECC decoder 114 corrects the errors in the original code words to get the correct code words and writes them into the data buffer 106.

According to FIG. 1, when the conventional decoding system performs the decoding process, each module of the system needs to access to the data buffer. If each module of the decoding system can access to the data buffer synchronously, the system can increase the decoding speed to become a high speed DVD. However, according to FIGS. 2 and 3 the ECC decoder 114 in the conventional decoding system must access to the data buffer when it performs the error correction decoding along the PI and PO directions of the ECC block each time, thereby it takes a lot of time and limits the speed of the entire DVD system for many accesses to the data buffer. Now there are several solutions for the above bottleneck: enhancing the clock frequency of the decoding system, increasing the bus width of the decoding system, and decreasing the access times to the data buffer, etc.

SUMMARY OF THE INVENTION

It is therefore an object of the invention to provide a decoding system and method for an optical disk for decreasing the access times to the data buffer. In this way, it can enhance the parallel processing capability of the decoding system and increase the decoding speed to become a high speed DVD.

In one embodiment, a demodulator performs the demodulation and transfers the generated ECC block to an ECC decoder. Then, the ECC decoder writes the main data into a data buffer and calculates the PI syndrome and the PO syndrome. Then, the ECC decoder performs the error correction decoding along the PI and PO directions of the ECC block, and writes the corrected part of the main data into the data buffer. After the ECC decoder finishes the error correction decoding of the ECC block, a de-scrambler and EDC check reads the main data stored in the data buffer to de-scramble the main data and checks whether errors are corrected. After finishing the preceding processes, the main data is transferred to the host through an ATAPI when the host needs data.

In anther embodiment, a demodulator performs the demodulation and transfers the generated ECC block to a syndrome generator, and the syndrome generator writes the main data into the data buffer and calculates the PI syndrome and the PO syndrome. Then, the syndrome generator writes the calculated syndromes into two separate rooms. After the syndrome generator finishes receiving the entire ECC block, the syndromes will then transfer to another two rooms. In this way, the ECC decoder can read the syndromes immediately, and finish the error correction decoding of the main data stored in the data buffer before receiving the next ECC block. Then, the de-scrambler and EDC check reads the main data stored in the data buffer to de-scramble the main data and check whether errors are corrected. After finishing the preceding processes, the main data is transferred to the host through an ATAPI when the host needs data.

In another embodiment, a demodulator performs the demodulation and transfers the generated ECC block to the ECC decoder. Then, the ECC decoder writes the main data into the data buffer, meanwhile a first de-scrambler and EDC check de-scrambles the main data and checks whether errors are corrected, and the ECC decoder calculates the PI syndrome and the PO syndrome and writes the calculation results into two memories. Afterward, the ECC decoder performs the error correction decoding along the PI and PO directions of the ECC block in turn. Then, a second de-scrambler and EDC check de-scrambles the main data, which EDC checking is not finished yet and checks again whether errors are corrected. When the host needs the main data, an ATAPI reads the main data stored in the data buffer, then de-scrambles and transmits the main data to the host.

The foregoing is a brief description of some deficiencies in the prior art and advantages of this invention. Other features, advantages and embodiments of the invention will be apparent to those skilled in the art from the following description, accompanying drawings and appended claims.

BRIEF DESCRIPTION OF DRAWINGS

The following detailed description, given by way of examples and not intended to limit the invention to the embodiments described herein, will be best understood in conjunction with the accompanying drawings, in which.

DETAILED DESCRIPTION OF THE INVENTION

Detailed descriptions of the preferred embodiment are provided herein. It is to be understand, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or the present invention in virtually any appropriately detailed system, structure or manner.

Figure 3:
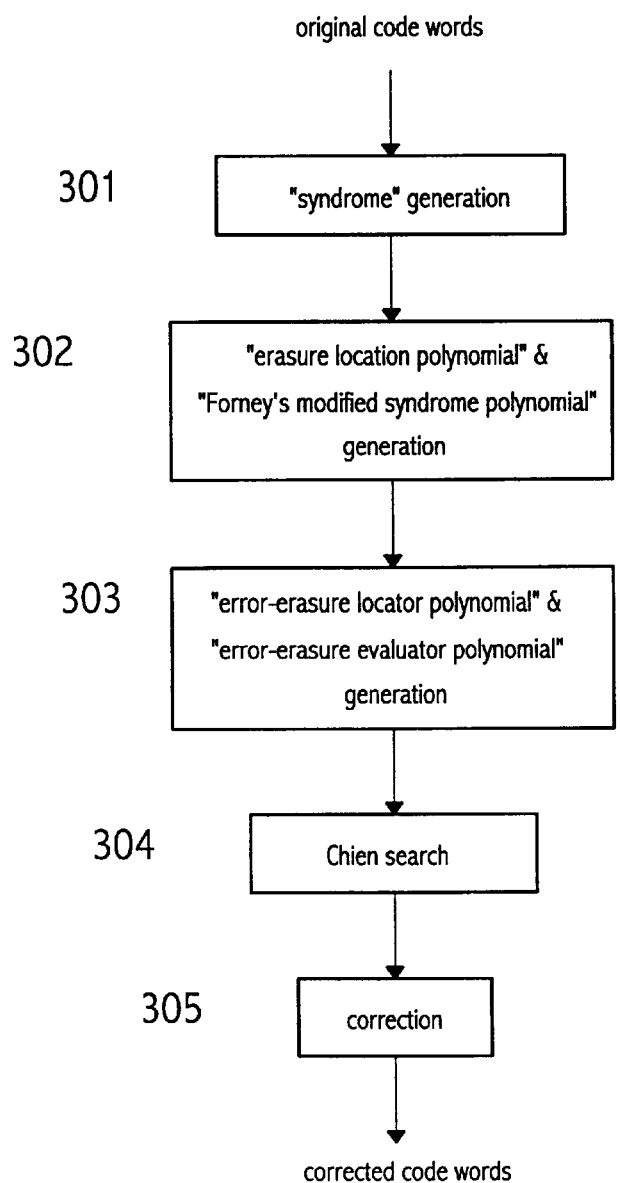
FIG. 3 illustrates a flow chart of decoding RS code in the conventional ECC decoder.

As shown in FIG. 3, no matter the ECC decoder performs the error correction decoding along the PI or PO direction of the ECC block, the first step is to generate syndromes. Assume that before performing the error correction decoding the data in one direction of the ECC block is r(X), and the data after performing the error correction decoding becomes r'(X), then r'(X)=r(X)+e(X), where the e(X) represents the error. Thus, a new syndrome after performing the error correction decoding can be shown as follows:

$$S_{k(r')}(X) = \sum_{i=0}^{n-1} r'_i \alpha^{ik} = \sum_{i=0}^{n-1} (r_i + e_i)\alpha^{ik} = \sum_{i=0}^{n-1} r_i \alpha^{ik} + \sum_{i=0}^{n-1} e_i \alpha^{ik} = S_{k(r)}(X) + S_{k(e)}(X)$$

According to the above equation, when the decoding system performs the error correction decoding, the syndromes before the error correction decoding appended with the syndrome of the error produces the new syndrome. Therefore, the ECC decoder calculates the PI syndrome and the PO syndrome before the decoding system performs the error correction decoding. Then, when the decoding system performs the error correction decoding, the ECC decoder calculates the syndrome of the error of the PI direction and adds the original syndrome of the data of the PI direction to generate a new PI syndrome; similarly, the ECC decoder calculates the syndrome of the error of the PO direction and adds the original syndrome of the data of the PO direction to generate a new PO syndrome. That is, the PI syndrome and the PO syndrome all correspond to a corrected ECC block.

Figure 1:
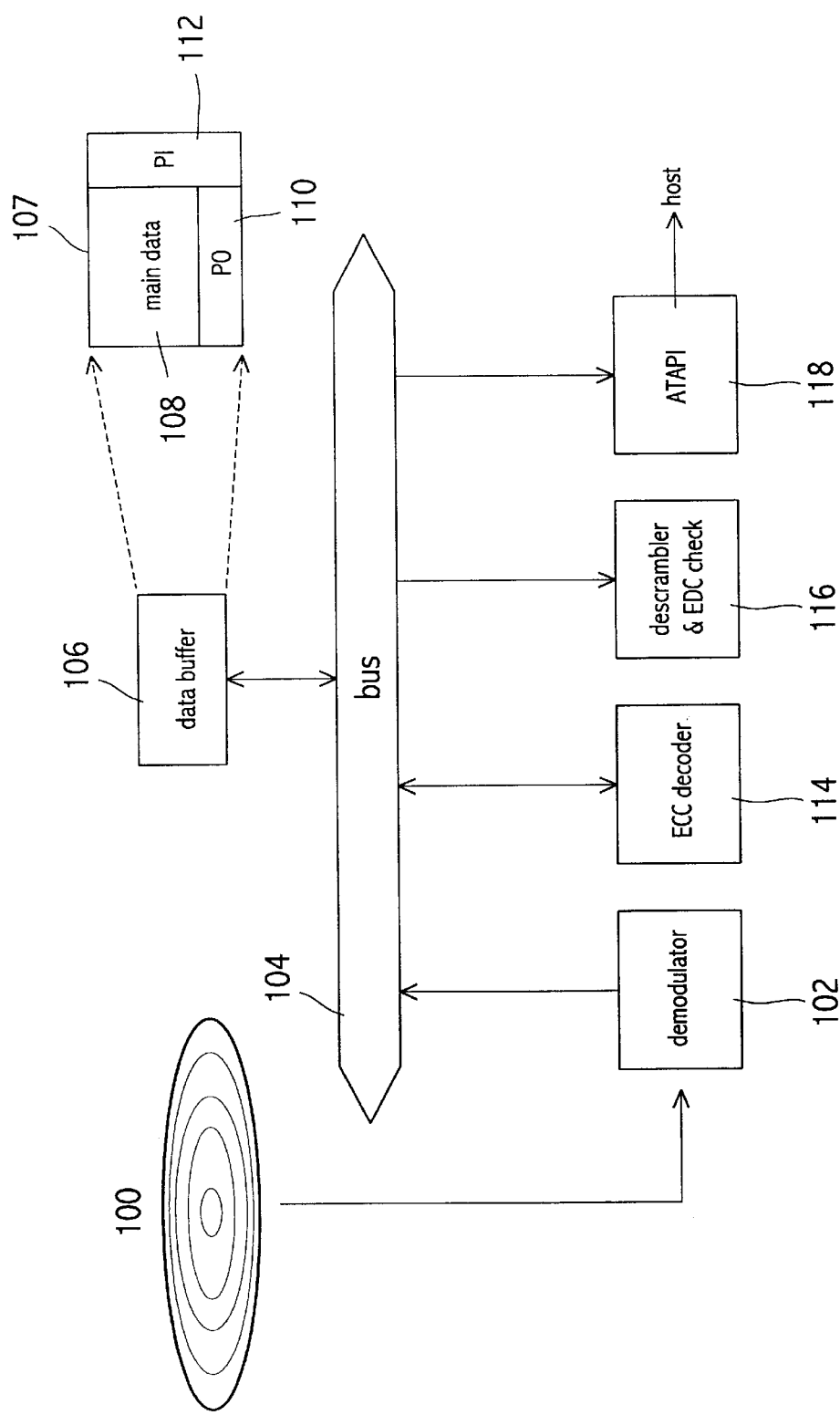
FIG. 1 illustrates a block diagram of a conventional decoding system in a DVD storage device.
Figure 2:
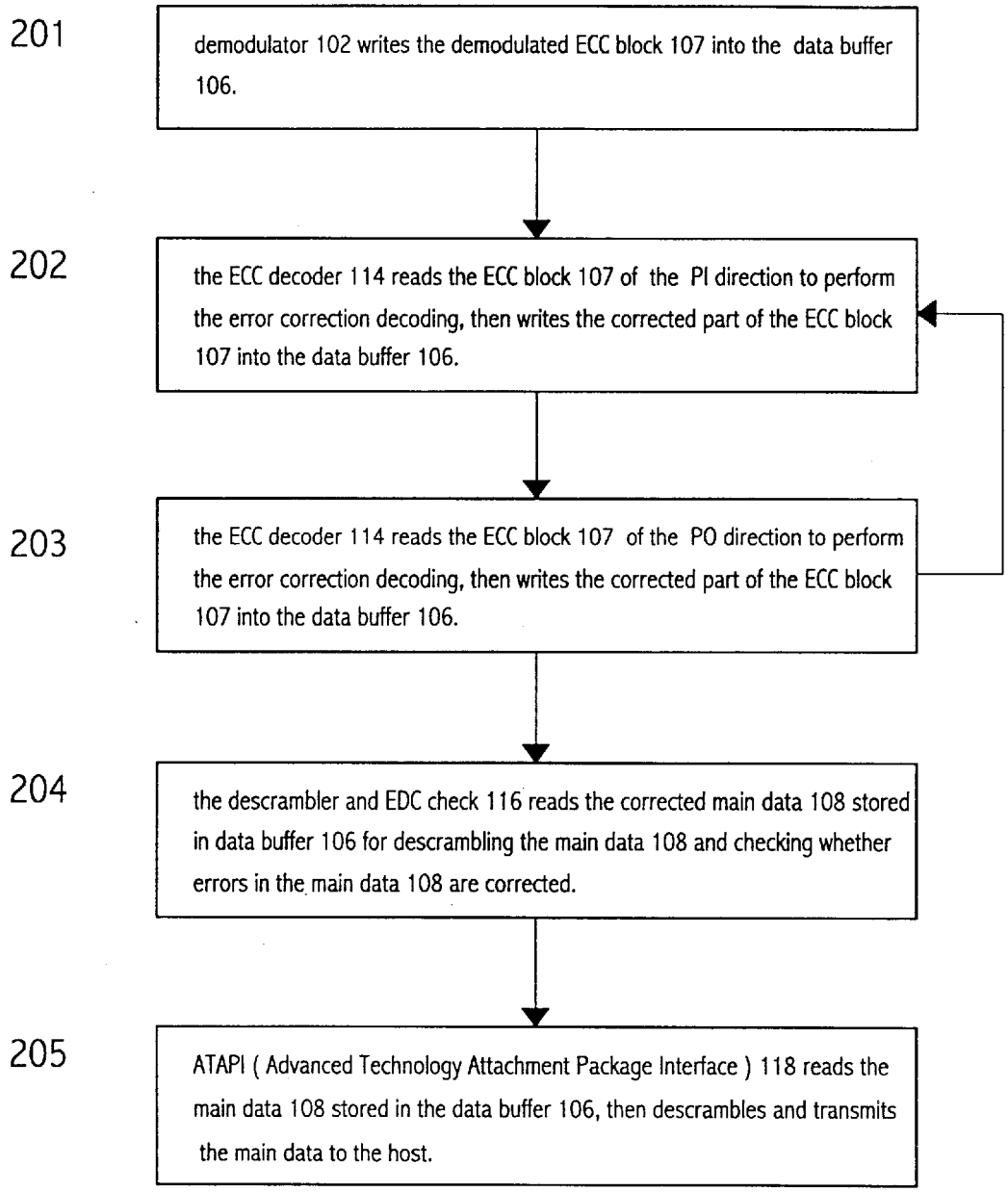
FIG. 2 illustrates a flow chart of the conventional decoding system accessing to the data buffer in a DVD storage device.
Figure 4:
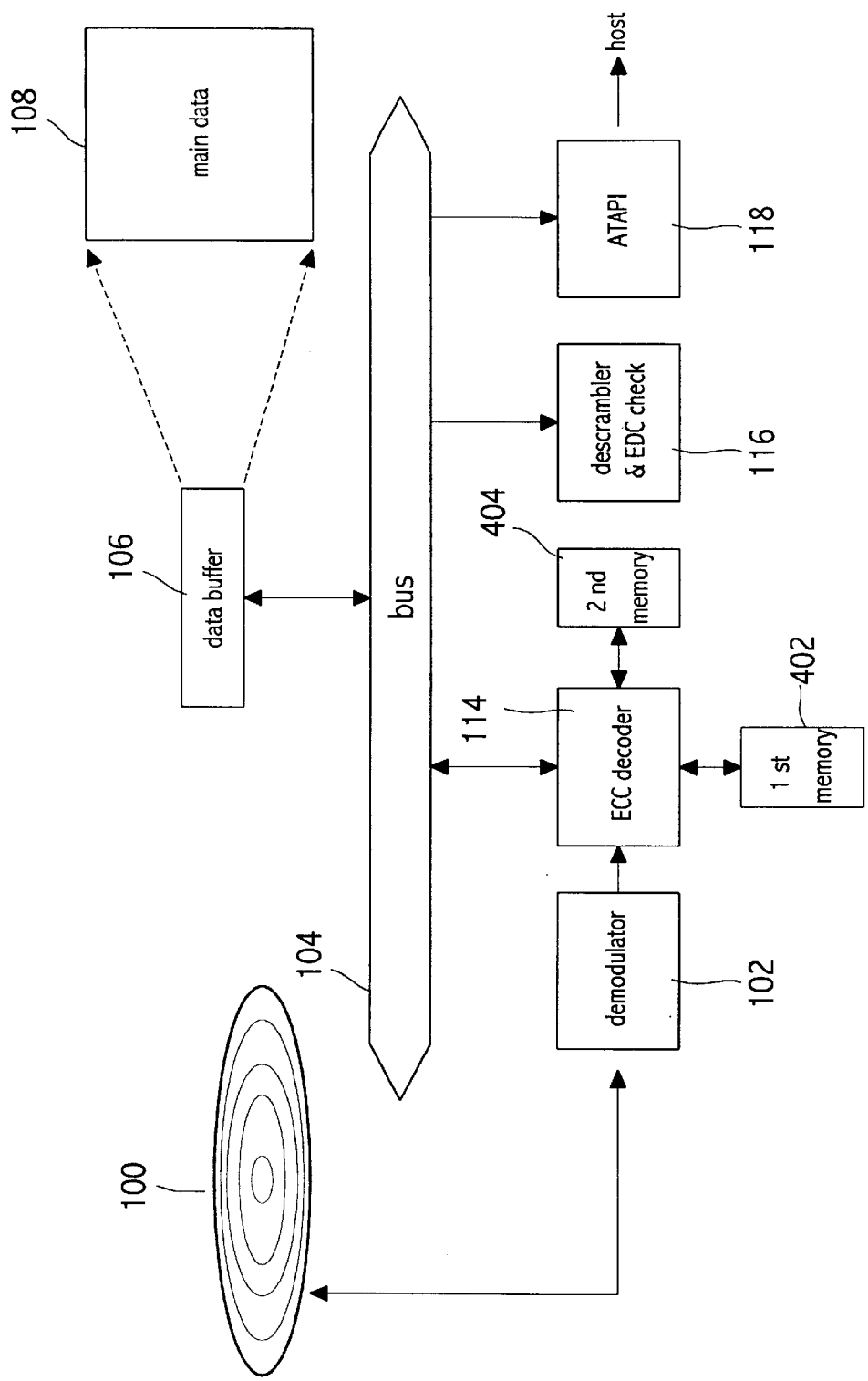
FIG. 4 illustrates a block diagram of a first embodiment of the present invention.

Turning now to FIG. 4, it illustrates a block diagram of a first embodiment of the present invention. The decoding system in FIG. 4 is similar to FIG. 1. The difference is that the data buffer 106 in FIG. 4 stores only the main data 108, and the demodulator 102 transfers the ECC block 107 directly to the ECC decoder 114. Besides, there are two more memories connected to the ECC decoder 114. As shown in FIG. 4, the demodulator 102 reads the data from the disk 100 to perform the demodulation and transfers the generated ECC block to the ECC decoder 114, wherein the ECC block comprises main data 108, PO and PI. However, after the ECC decoder 114 receives the ECC block, it only writes the main data 108 of the ECC block into the data buffer 106 and calculates the PI syndrome and the PO syndrome by using the inner-code of RS and outer-code of RS. Then, the ECC decoder 114 writes the calculation results into the first memory 402 and the second memory 404 respectively, while the PI and PO are abandoned after the calculation of the syndromes. The ECC decoder 114 performs the error correction decoding along the PI and PO direction of the ECC block by the syndromes stored in the first memory 402 and the second memory 404. At this time the ECC decoder 114 will calculate both the PI syndrome and the PO syndrome simultaneously, then corrects the PI syndrome and the PO syndrome in the first memory 402 and the second memory 404 respectively and writes the corrected part of the main data 108 into the data buffer 106. Since the calculated syndromes correspond to the latest ECC block and the host needs only the main data, it does not need to update the PI and PO but the PI syndrome and the PO syndrome when errors occur in the PI and PO. Thus, the PI and PO can be abandoned. After the ECC decoder 114 finishes the error correction decoding of the ECC block, the de-scrambler and EDC check 116 reads the main data 108 stored in the data buffer 106 to de-scramble the main data 108 and check whether errors are corrected. After finishing the preceding processes, the main data 108 is transferred to the host through the ATAPI 118 when the host needs data.

Figure 5:
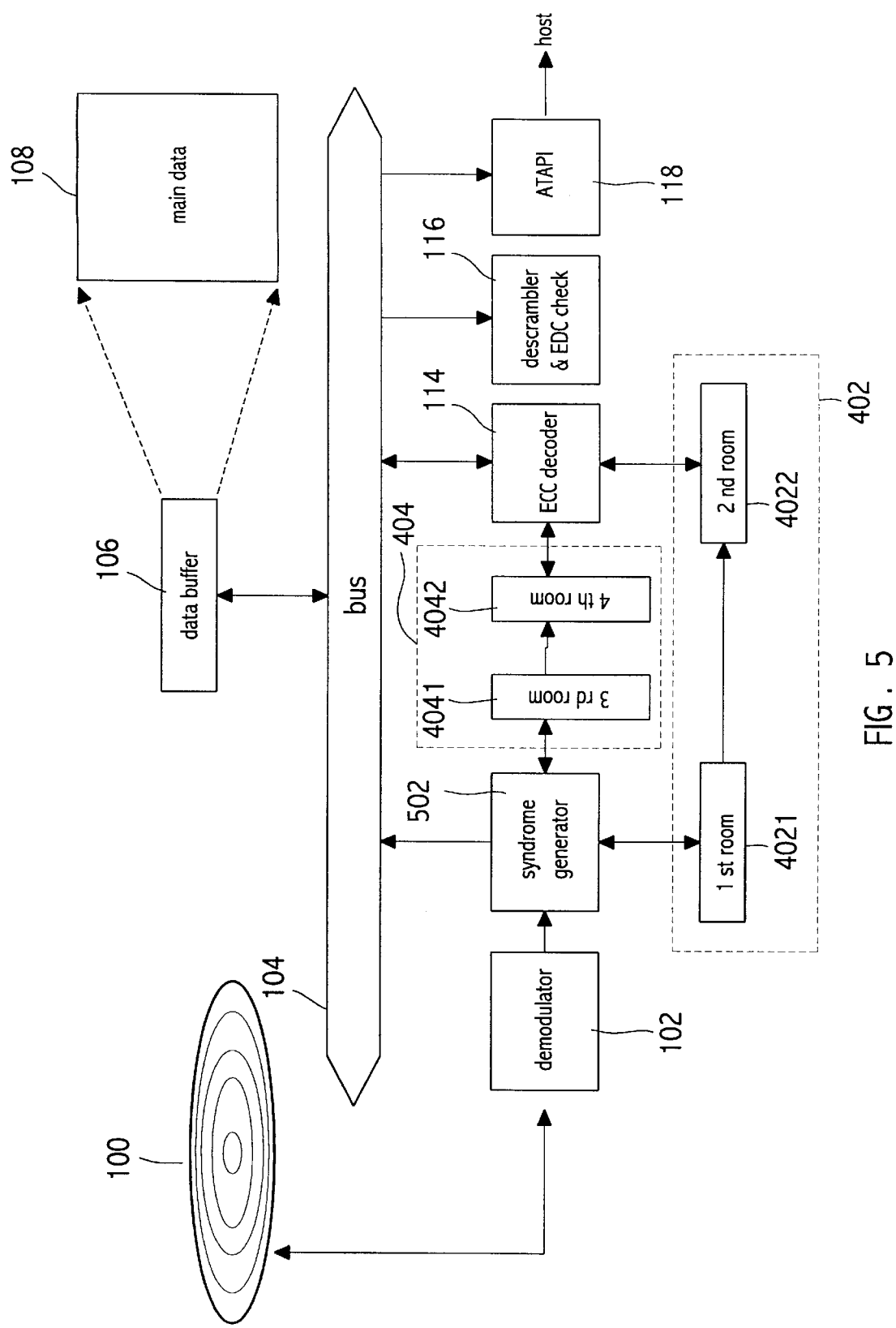
FIG. 5 illustrates a block diagram of a second embodiment of the present invention.

Referring to FIG. 5, it illustrates a block diagram of a second embodiment of the present invention. The decoding system in FIG. 5 is similar to FIG. 4, the difference is as follows: the first memory 402 is divided into the first room 4021 and the second room 4022, while the second memory 404 is divided into the third room 4041 and the fourth room 4042. Besides, the demodulator 102 transfers the ECC block directly to the syndrome generator 502, then the syndrome generator 502 writes the main data 108 of the ECC block into the data buffer 106 and calculates the PI syndrome and the PO syndrome by using the inner-code of RS and the outer-code of RS. Then, the syndrome generator 502 writes the calculated PI syndrome and the calculated PO syndrome into the first room 4021 and the third room 4041 respectively. The first room 4021 and the third room 4041 are for continuously receiving the next PI syndrome and PO syndrome generated by the syndrome generator 502. After the syndrome generator 502 finishes receiving the entire ECC block, the PI syndrome and the PO syndrome, which stored in the first room 4021 and the third room 4041, will transfer to the second room 4022 and the fourth room 4042 respectively. In this way, the ECC decoder 114 can read the syndromes stored in the second room 4022 and the fourth room 4042 immediately, and finish the error correction decoding of the main data 108 stored in the data buffer 106 before receiving the next ECC block.

Figure 6:
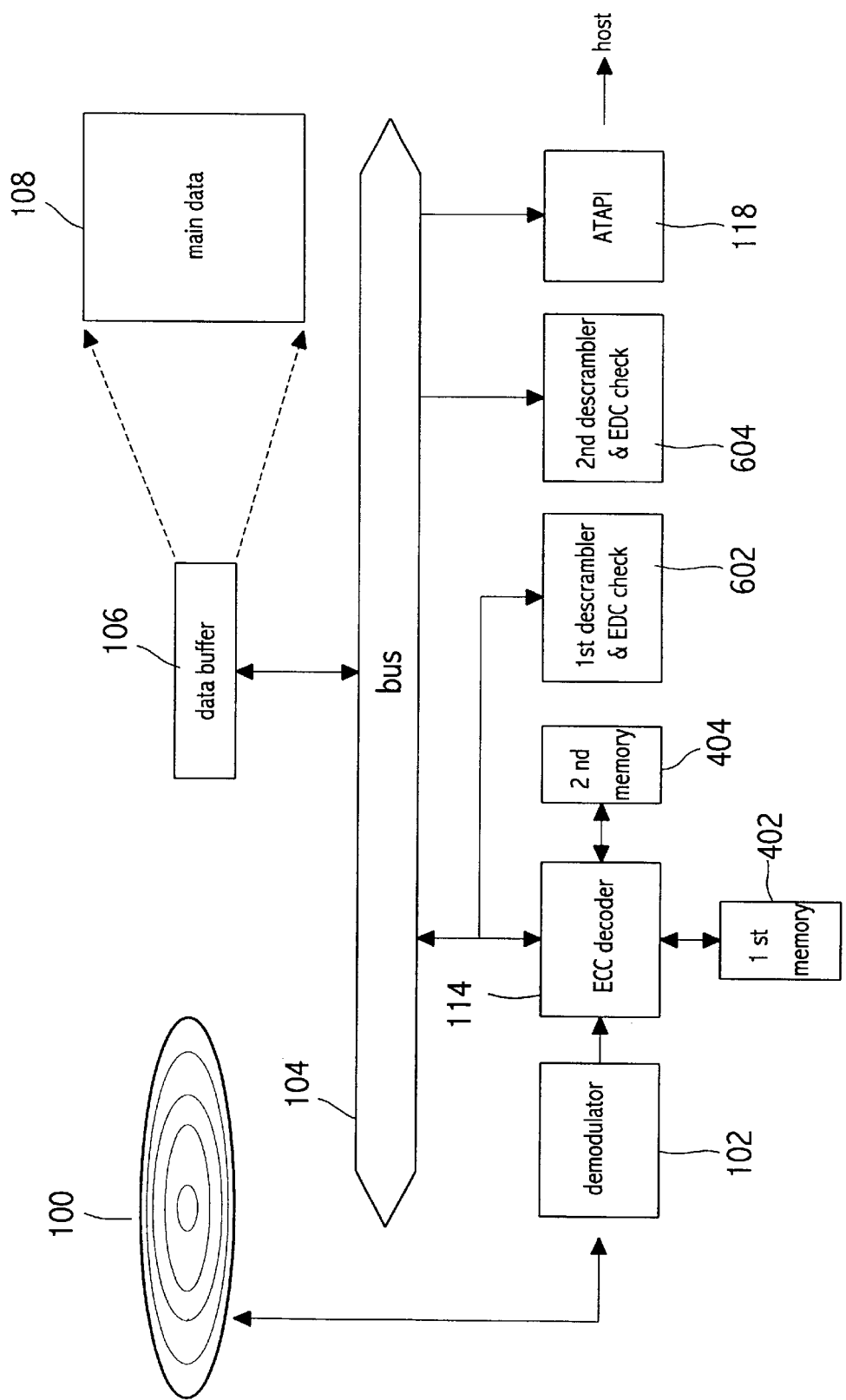
FIG. 6 illustrates a block diagram of a third embodiment of the present invention.

Since the reading direction of the main data 108 for the de-scrambler and EDC check 116 is the same as the ECC decoder 114, the de-scrambler and EDC check 116 can perform the de-scrambling and checking simultaneously when the ECC decoder transfers the main data 108 to the data buffer 106. Thus, as shown in FIG. 6, when the ECC decoder 114 writes the main data 108 into the data buffer 106, meanwhile the main data 108 is also transferred to the first de-scrambler and EDC check 602. The ensuing error correction decoding along the PI and PO directions of the ECC block can ignore the part of the main data 108, which the EDC checking is finished, so that it can avoid occurring errors during the ensuing decoding process. After finishing the ensuing decoding process along the PI and PO directions of the ECC block, the second de-scrambler and EDC check 604 will de-scramble the main data 108 and check again whether errors are corrected.

Figure 7:
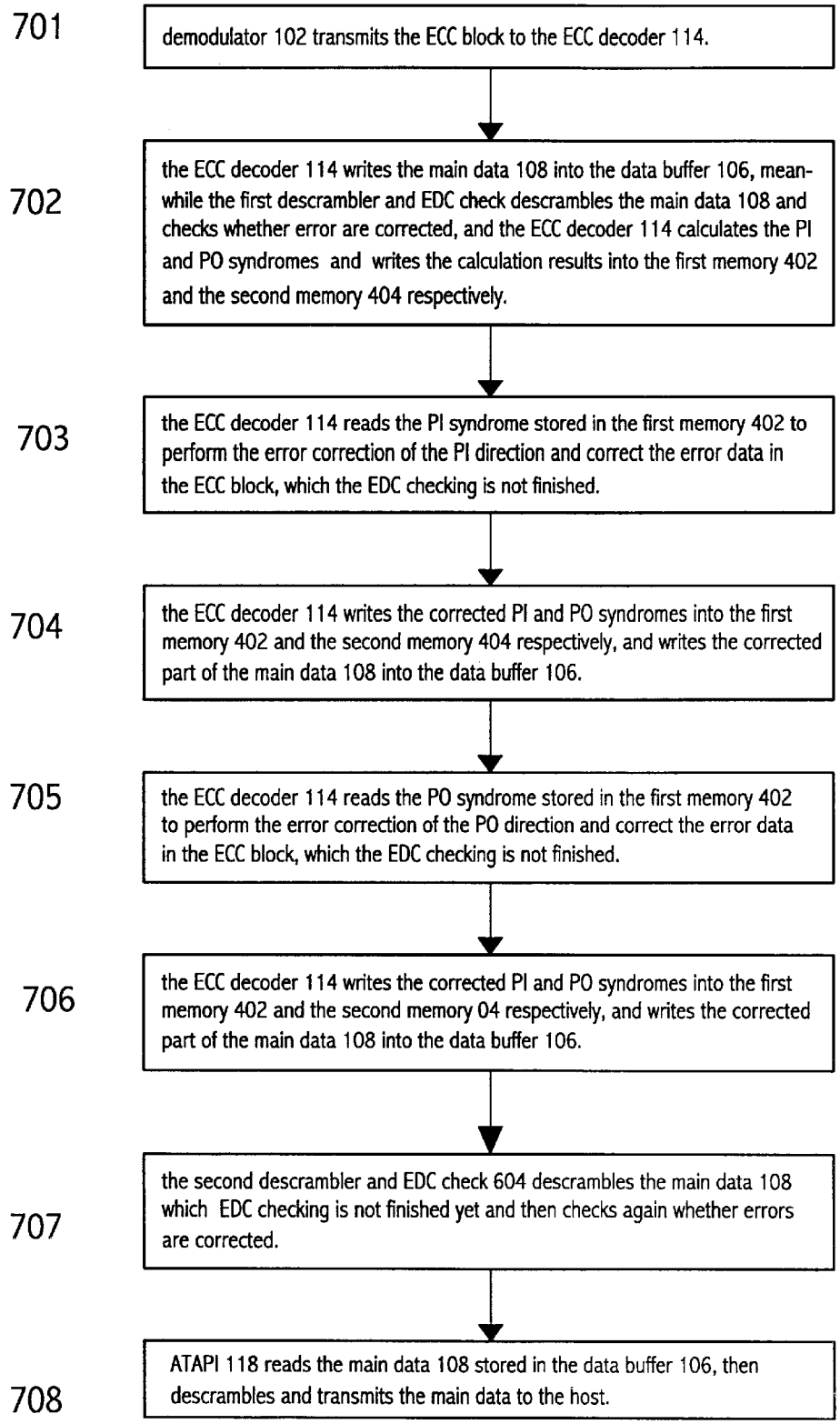
FIG. 7 illustrates a flow chart of the decoding process in FIG. 6.

To explain the block diagram in FIG. 6 more clearly, referring now to FIG. 7. It illustrates a flow chart of decoding process in FIG. 6. The process is as follows: First, at a step 701, the demodulator 102 transmits the ECC block to the ECC decoder 114. Second, at a step 702, the ECC decoder 114 writes the main data 108 of the ECC block into the data buffer 106, meanwhile the first de-scrambler and EDC check 602 de-scrambles the main data 108 and checks whether errors are corrected, and the ECC decoder 114 calculates the PI syndrome and the PO syndrome by using the inner-code of RS and outer-code of RS, and writes the calculation results into the first memory 402 and the second memory 404 respectively. Afterward, at a step 703, the ECC decoder 114 reads the PI syndrome stored in the first memory 402 to perform the error correction decoding of the PI direction and correct the error in the ECC block, which the EDC checking is not finished. Continuing the step 703, at a step 704, the ECC decoder 114 corrects the PI syndrome and the PO syndrome in the first memory 402 and the second memory 404 respectively, and writes the corrected part of the main data 108 into the data buffer 106. Then, at a step 705, the ECC decoder 114 reads the PO syndrome stored in the first memory 402 to perform the error correction decoding of the PO direction and correct the error data in the ECC block, which the EDC checking is not finished. Continuing the step 705, at a step 706, the ECC decoder 114 corrects the PI syndrome and the PO syndrome in the first memory 402 and the second memory 404 respectively, and writes the corrected part of the main data 108 into the data buffer 106. After finishing the step 706, the system can repeat performing the error correction decoding along the PI and PO direction of the ECC block to enhance the error correction capability according to the setting of the system. After finishing the step 706, at a step 707, the second de-scrambler and EDC check 604 de-scrambles the main data 108, which EDC checking is not finished yet and then checks whether errors are corrected again. When the host needs the main data 108, the ATAPI 118 reads the main data 108 stored in the data buffer 106, then de-scrambles and transmits the main data to the host at a step 708.

According to FIG. 4 to FIG. 7, during the decoding system of the present invention performs the decoding process, the ECC decoder 114 does not need to repeat reading the main data 108 from the data buffer 106 when performing the error correction decoding along the PI and PO directions of the ECC block. Thus, it can largely decrease the access times to the data buffer. Besides, the data buffer of the present invention only stores the main data 108 of the ECC block, therefore, the data buffer can be a smaller one. Further, the ECC decoder 114 of the present invention is a RSPC (Reed Solomon Product Code) structure. The data buffer 106 can be a DRAM, while the first memory 402 and the second memory 404 can be SRAMs. In comparison with the conventional decoding system, the decoding system of the present invention only increases two memories and performs the error correction decoding immediately after finishing the demodulation. No need to increase the clock frequency and the bus width of the decoding system, it can effectively decrease the access times to the data buffer and the system response time, increase the parallel process capability and the speed of the decoding, thus, it can become a high speed optical storage device, such as a DVD.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A decoding system for receiving and decoding data from an optical disk, comprising:
   a demodulator for receiving and demodulating data from the disk to generate an ECC (Error Correction Code) block that comprises main data, a PI (Parity of Inner-code), and a PO (Parity of Outer-code), said main data appended with said PO forming an outer-code of RS (Reed Solomon), and said main data appended with said PO and said PI forming an inner-code of RS;
   a data buffer for storing said main data;
   a memory for storing a PI syndrome and a PO syndrome;
   an ECC decoder for performing error correction decoding of said ECC block;
   a first de-scrambler and EDC (Error Detection Code) check for de-scrambling said main data stored in said data buffer and checking whether errors in said main data being corrected;

a second de-scrambler and EDC check for de-scrambling said main data which EDC checking is not finished yet and then checking again whether errors in said main data being corrected; and an ATAPI (Advanced Technology Attachment Packet Interface) for reading said main data stored in said data buffer, de-scrambling and transmitting said main data to the host.

2. The decoding system as claimed in claim 1 wherein said ECC decoder reads said ECC block from said demodulator, then said first de-scrambler and EDC check performs de-scrambling and EDC checking while said ECC decoder writes said main data into said data buffer; further said ECC decoder calculates said PI syndrome and said PO syndrome by said inner-code of RS and said outer-code of RS, and writes the calculation results into said memory; then said ECC decoder reads said PI syndrome from said memory to perform error correction decoding of the PI direction, and said ECC decoder writes the corrected said PI syndrome and said PO syndrome into said memory and writes the corrected part of said main data into said data buffer; afterward said ECC decoder reads said PO syndrome from said memory to perform error correction decoding of the PO direction, and said ECC decoder writes the corrected said PI syndrome and said PO syndrome into said memory and writes the corrected part of said main data into said data buffer.

3. The decoding system as claimed in claim 1 wherein said demodulator converts M bit code words into N bit data symbols (M>N).

4. The decoding system as claimed in claim 1 wherein said ECC decoder can be a RSPC (Reed Solomon Product Code) structure.

5. The decoding system as claimed in claim 1 wherein said data buffer can be a DRAM (Dynamic Random Access Memory).

6. A decoding system as claimed in claim 1 wherein said memory can be a SRAM (Static Random Access Memory).

* * * * *